US012610758B2

(12) United States Patent
Wong et al.

(10) Patent No.: US 12,610,758 B2
(45) Date of Patent: Apr. 21, 2026

(54) DIELECTRIC ON DIELECTRIC SELECTIVE DEPOSITION USING ANILINE PASSIVATION

(71) Applicants: Applied Materials, Inc., Santa Clara, CA (US); Regents of the University of California, Oakland, CA (US)

(72) Inventors: Keith T. Wong, Mountain View, CA (US); Srinivas D. Nemani, Saratoga, CA (US); Ellie Y. Yieh, San Jose, CA (US); Andrew C. Kummel, San Diego, CA (US); Yunil Cho, San Diego, CA (US); James Huang, San Diego, CA (US)

(73) Assignees: Applied Materials, Inc., Santa Clara, CA (US); Regents of the University of California, Oakland, CA (US)

( * ) Notice: Subject to any disclaimer, the term of this patent is extended or adjusted under 35 U.S.C. 154(b) by 617 days.

(21) Appl. No.: 17/960,979

(22) Filed: Oct. 6, 2022

(65) Prior Publication Data

US 2024/0120195 A1     Apr. 11, 2024

(51) Int. Cl.
  *H01L 21/02*        (2006.01)
  *H01L 21/67*        (2006.01)
(52) U.S. Cl.
  CPC .... *H01L 21/0228* (2013.01); *H01L 21/02068* (2013.01); *H01L 21/02123* (2013.01); *H01L 21/02304* (2013.01); *H01L 21/02312* (2013.01); *H01L 21/67017* (2013.01)
(58) Field of Classification Search
  CPC ........... H01L 21/0228; H01L 21/02068; H01L 21/02123; H01L 21/67017
  See application file for complete search history.

(56) References Cited

U.S. PATENT DOCUMENTS

| | | |
|---|---|---|
| 2009/0181178 A1 | 7/2009 | Edelstein et al. |
| 2012/0220116 A1 | 8/2012 | Noori et al. |
| 2019/0277783 A1* | 9/2019 | Larson .................... C23C 16/52 |
| 2020/0258744 A1* | 8/2020 | Thareja ............. H01L 21/76897 |
| 2021/0301391 A1 | 9/2021 | Givens et al. |

(Continued)

FOREIGN PATENT DOCUMENTS

KR          20210004231 A          1/2021

OTHER PUBLICATIONS

Merkx, Marc J. M., et al., Chemistry of Materials, "Area-Selective Atomic Layer Deposition of TiN Using Aromatic Inhibitor Molecules for Metal/Dielectric Selectivity", https://dx.doi.org/10.1021/acs.chemmater.0c02370, Chem. Mater. 2020, 32, 7788-7795, 8 pages.

(Continued)

*Primary Examiner* — Alexander G Ghyka
(74) *Attorney, Agent, or Firm* — Lowenstein Sandler LLP

(57) ABSTRACT

A method includes forming a conductive material on a first dielectric layer, exposing the conductive material to aniline to produce a passivated surface of the conductive material, and after exposing the conductive material to aniline, forming a second dielectric layer on the first dielectric layer using a deposition process. The deposition process is a water-free and plasma-free deposition process, and the second dielectric layer does not form on the passivated surface of the conductive material.

16 Claims, 4 Drawing Sheets

*100*

(56)                  References Cited

U.S. PATENT DOCUMENTS

2022/0076949 A1    3/2022  Tois et al.
2022/0081575 A1    3/2022  Shinmen et al.
2022/0130664 A1    4/2022  Wang et al.

OTHER PUBLICATIONS

Choi, Jong Youn, et al., Applied Surface Science, "Selective pulsed chemical vapor deposition of water-free HfOx on Si in preference to SiCOH and passivated SiO2", journal homepage: www.elsevier.com/locate/apsusc, https://doi.org/10.1016/j.apsusc.2020.145733, Available online Feb. 11, 2020, 10 pages.
Cho, Yunil, et al., Applied Surface Science, "Inherent selective pulsed chemical vapor deposition of amorphous hafniumoxide / titanium oxide nanolaminates", journal homepage: www.elsevier.com/locate/apsusc, https://doi.org/10.1016/j.apsusc.2022.154010, Available online Jun. 24, 2022, 10 pages.
Huang, James, et al., Applied Materials & Interfaces, "Selective Pulsed Chemical Vapor Deposition of Water-Free TiO2/Al2O3 and HfO2/Al2O3 Nanolaminates on Si and SiO2 in Preference to SiCOH", www.acsami.org, https://doi.org/10.1021/acsami.1c19810, Published: Mar. 22, 2022, 12 pages.
Nguyen, Son Van, et al., 2021 IEEE International Interconnect Technology Conference(IITC) Jul. 6-9, 2021 Online, 1IBM Semiconductor Technology Research, Albany, NY 12203 USA, Lam Research Corporation, Tualatin, Oregon, 97062 USA, "Selective deposition of AlOx for Fully Aligned Via in nano Cu interconnects", 2 pages.
Chen, H.P., Taiwan Semiconductor Manufacturing Company, Hsinchu, Taiwan, "Fully Self-Aligned Via Integration for Interconnect Scaling Beyond 3nm Node", Downloaded on Sep. 6, 2022 at 20:32:35 UTC from IEEE Xplore, 4 pages.
Suh, Taewon, et al., Applied Materials & Interfaces, "Competitive Adsorption as a Route to Area-Selective Deposition", www.acsami.org, ACS Appl. Mater. Interfaces 2020, 12, 9989-9999, https://dx.doi.org/10.1021/acsami.9b22065, Published: Feb. 11, 2020, 11 pages.
Yarbrough, Josiah, Journal of Vacuum Science & Technology A, "Next generation nanopatterning using small molecule inhibitors for area-selective atomic layer deposition", J. Vac. Sci. Technol. A 39, 021002 (2021); https://doi.org/10.1116/6.0000840, 13 pages.
Abstracts for submissions to a conference called "The 6th Area Selective Deposition Workshop (ASD 2022)", Apr. 21-22, 2022, https://asd2022.avs.org/, 29 pages.
Lengers, Rick J., Eindhoven University of Technology, "Precursor blocking mechanisms of aniline inhibitor molecules in area-selective atomic layer deposition of TaN", Jul. 28, 2021, 87 pages.
International Search Report and Written Opinion for International Application No. PCT/US2023/034396, mailed Jan. 23, 2024, 14 Pages.

* cited by examiner

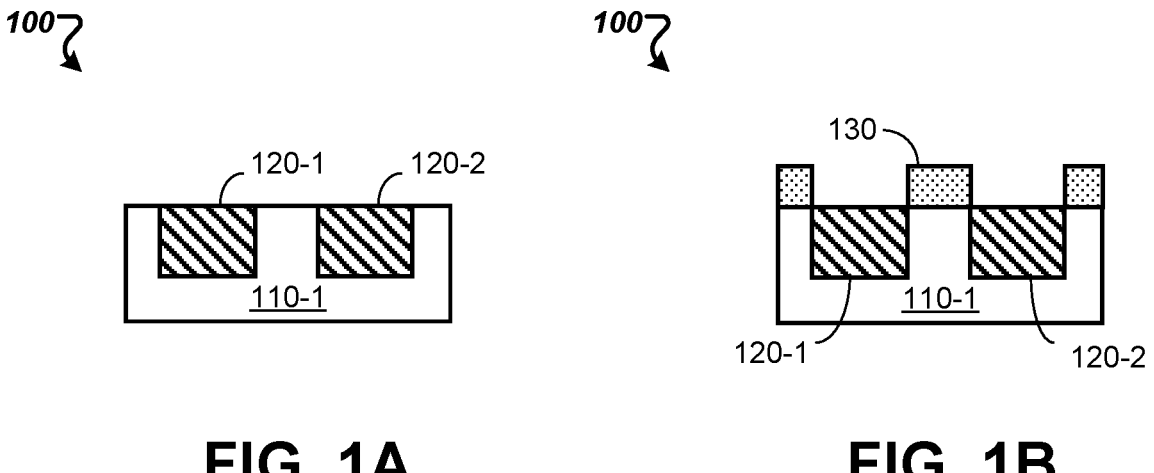
FIG. 1A              FIG. 1B
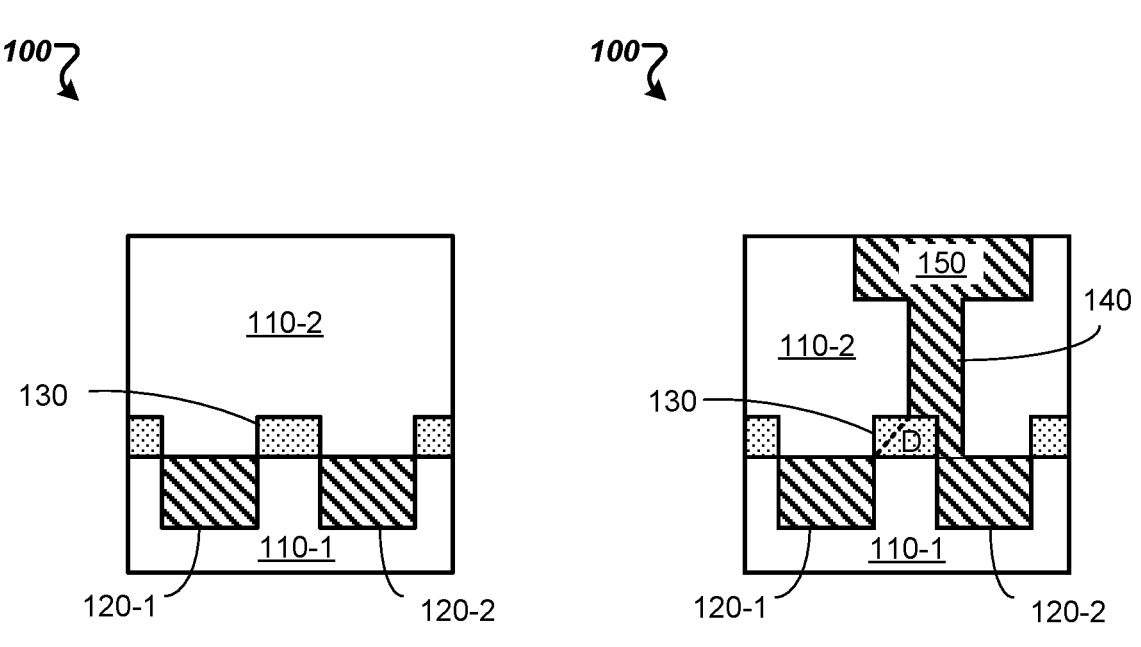
FIG. 1C              FIG. 1D

200

Form a first conductive material on a first dielectric layer
210

Selectively deposit a second dielectric layer on the first dielectric layer using aniline passivation
220

Form a third dielectric layer over the second dielectric layer and the conductive material
230

Form a second conductive material on the third dielectric layer
240

220

300

| | |
|---|---|
| 312 | Passivation chamber 310 |

Interface
340-1

| Cleaning chamber 350 | Interface 340-3 | Transfer chamber 320 |
|---|---|---|

352

Interface
340-2

Deposition chamber
330

322        324

DIELECTRIC ON DIELECTRIC SELECTIVE DEPOSITION USING ANILINE PASSIVATION

TECHNICAL FIELD

Embodiments of the present disclosure generally relate to electronic device fabrication. Particularly, embodiments of the present disclosure relate to dielectric-on-dielectric (DoD) selective deposition using aniline passivation.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gasses are flowed into the process chamber.

Electronic devices such as semiconductor devices are manufactured by performing a series of operations that may include deposition, oxidation, photolithography, ion implantation, etch, and so on to form many patterned layers. Often, it is beneficial to align features between layers. Misalignment of features (e.g., due to lithography and/or patterning limitations) in some instances may lead to shorting and/or capacitive coupling between, for example, vias and underlying metal lines. Such shorting and/or capacitive coupling can impair the functioning of the manufactured electronic devices.

SUMMARY

In accordance with an embodiment, a method is provided. The method includes forming a conductive material on a first dielectric layer, exposing the conductive material to aniline to produce a passivated surface of the conductive material, and after exposing the conductive material to aniline, forming a second dielectric layer on the first dielectric layer using a deposition process. The deposition process is a water-free and plasma-free deposition process, and the second dielectric layer does not form on the passivated surface of the conductive material.

In accordance with an embodiment, a system is provided. The system includes a passivation chamber for exposing a conductive material to aniline to produce a passivated surface of the conductive material. The conductive material is formed on a first dielectric layer disposed on a substrate. The system further includes a deposition chamber for, after exposing the conductive material to aniline, forming a second dielectric layer on the first dielectric layer using a deposition process. The deposition process is a water-free and plasma-free deposition process, and the second dielectric layer does not form on the passivated surface of the conductive material.

BRIEF DESCRIPTION OF THE DRAWINGS

The present disclosure is illustrated by way of example, and not by way of limitation, in the figures of the accompanying drawings in which like references indicate similar elements. It should be noted that different references to "an"

or "one" embodiment in this disclosure are not necessarily to the same embodiment, and such references mean at least one.

FIGS. 1A-1D are cross-sectional views illustrating an example method of forming a device implementing dielectric-on-dielectric (DoD) selective deposition using aniline passivation, in accordance with some embodiments.

DETAILED DESCRIPTION

Figure 2A:
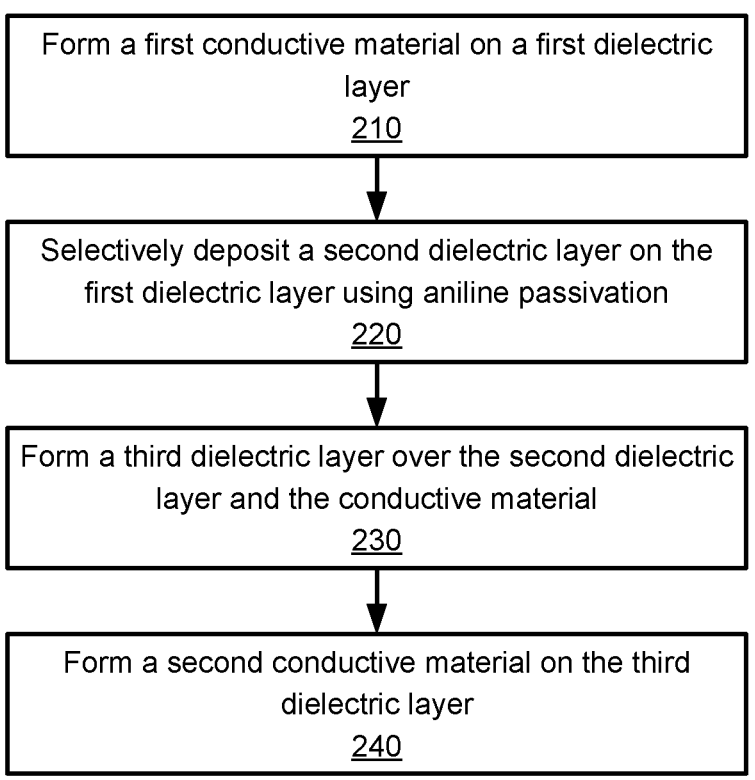
FIGS. 2A-2B are flowcharts of example methods of implementing dielectric-on-dielectric (DoD) selective deposition using aniline passivation, in accordance with some embodiments.

Embodiments described herein relate to dielectric-on-dielectric (DoD) selective deposition using aniline passivation. An electronic device can include dielectric material and conductive material. For example, an electronic device can include a dielectric layer, and a number of conductive lines disposed within the dielectric layer. More specifically, an electronic device can include a number of metallization levels, where each metallization level includes a respective set of conductive lines, and each pair of metallization levels is separated by a respective dielectric layer (e.g., interlevel dielectric (ILD) layer). Each conductive line can be formed within a respective trench.

An electronic device can further include a number of vias. A via refers to an electrical connection, or contact, between conductive lines within an electronic device. Each via can function as a respective interconnect between at least two metallization levels. For example, a through via is a via that is exposed at both ends of the device (i.e., the through via is formed through each metallization level from the top of the device to the bottom of the device). As another example, a buried via is a via that is exposed at neither end of the device (i.e., the buried via functions as an interconnect between internal metallization levels). As yet another example, a blind via is a via that is exposed at a single end of the device.

Electronic device processing techniques can involve performing patterning (e.g., photolithography). For example, patterning can include multiple and repetitive processes of deposition and etching, such as wet etching or dry etching (e.g., plasma etching), with photomasks ("masks") and resist films. Illustratively, conductive lines and vias can be formed using a suitable patterning process. For example, conductive lines and vias can be formed using a single damascene process, during which a conductive line and a via are formed sequentially. As another example, conductive lines and vias can be formed using a dual damascene process, during which a conductive line and a via can be formed simultaneously (e.g., by simultaneously filling both the via hole and the trench with conductive material). The conductive lines and vias can be formed from any suitable conductive material (e.g., metal). Examples of suitable conductive materials that can be used to form conductive lines and vias include copper (Cu), tungsten (W), cobalt (Co), molybdenum (Mo), ruthenium (Ru), etc.

As electronic devices scale down in size (e.g., as transistor sizes decrease), process variations can result during lithography/patterning (e.g., nanoscale patterning). One example of a process variation is mask misalignment between the mask and the patterned substrate. During exposure to light the mask misalignment can result in edge placement error equal to the distance between the target position of an edge of a feature and the actual position of the edge of the feature. Edge placement errors can cause detrimental effects that can lead to decreased device performance, such as shorts, increased resistance, capacitive coupling, etc.

Illustratively, mask misalignment can lead to via misalignment during via patterning, in which at least one via is patterned to be misaligned with respect to the conductive line. For example, an aligned via is a via having substantially correct edge placement on a corresponding conductive line (e.g., the via is centered with respect to the conductive line). However, due to mask misalignment during via patterning, an edge placement error can result with respect to an edge of the via (e.g., an edge of the via can be formed on a portion of the dielectric layer in a region between its corresponding conductive line and another adjacent conductive line).

Via misalignment can lead to shorting or capacitive coupling between the via and the adjacent conductive line, which can be a function of the horizontal spacing between the via and the adjacent conductive line (e.g., a distance between the lower surface of the via and the upper surface of the adjacent conductive line). The effects of via misalignment can become more pronounced as transistor sizes become smaller (e.g., on the nanometer (nm) scale). Accordingly, as transistor sizes scale further downward, it is important to maintain a minimum amount of spacing to prevent shorting or capacitive coupling due to process variations that result in via misalignment.

One example of a method that can be used to address via misalignment is the conductive line recess method. During the conductive line recess method, after trenches within the dielectric layer are filled with a conductive material (e.g., metal) to form the conductive lines, the conductive lines can be recessed to a particular depth within their respective trenches using an etch process. The vias can then be formed such that the upper surface of each conductive line is located below the upper surface of the dielectric layer. Thus, if a via formed on a conductive line is a misaligned via, then the misaligned via can have an edge, formed on the dielectric layer, that is located at some distance above the upper surface of the adjacent conductive line. This can cause the misaligned via and the adjacent conductive line (e.g., the lower surface of the misaligned via and the upper surface of the adjacent conductive line) to be separated by a diagonal spacing. The diagonal spacing is a function of the horizontal spacing described above, as well as a vertical distance between the misaligned via and the adjacent conductive line. That is, the diagonal spacing has a greater length than the horizontal spacing, and can therefore help prevent shorting or capacitive coupling. However, the conductive line recess method suffers from a number of drawbacks. For example, the conductive line recess method can exhibit poor uniformity over a wafer and across different pitch sizes, high conductive line surface roughness, and material degradation.

Another example of a method that can be used to address process variations such as via misalignment is the dielectric-on-dielectric (DoD) method. The DoD method utilizes a selective dielectric material deposition approach that can, for example, increase the spacing between a misaligned via and an adjacent conductive line. More specifically, after trenches within a first dielectric layer (e.g., first ILD) are filled with a conductive material (e.g., metal) to form the conductive lines, a second dielectric layer can be selectively deposited on the exposed surfaces of the first dielectric layer. The second dielectric layer can be formed to a height similar in magnitude to the depth achieved during the recess method described above. Similar to the recess method, if a via formed on a conductive line is a misaligned via, then the misaligned via can have an edge, formed on the second dielectric layer, that is located at some distance above the upper surface of the adjacent conductive line. Similar to the recess method, the DoD method can cause the misaligned via and the adjacent conductive line to be separated by a diagonal spacing having a length that is greater than the horizontal spacing, and thus help prevent shorting or capacitive coupling.

The first dielectric layer can include any suitable dielectric material. In some implementations, the first dielectric layer can include an oxide. In some implementations, the first dielectric layer can include a nitride. Examples of suitable dielectric materials that can be used to form the first dielectric layer include silicon dioxide ($SiO_2$), carbon-doped silicon oxides (e.g., SiOC, SiCOH), silicon nitride ($Si_3N_4$), etc. The second dielectric layer can include any suitable dielectric material. In some implementations, the second dielectric layer can include an oxide. Examples of suitable dielectric materials that can be used to form the second dielectric layer include hafnium dioxide ($HfO_2$), titanium dioxide ($TiO_2$), aluminum oxide ($Al_2O_3$), $SiO_2$, etc.

To implement the dielectric layer formation method, the second dielectric layer can be selectively deposited on the first dielectric layer in preference to the conductive material (e.g., Cu, W, Co, Mo or Ru). Selectivity can be defined as, for example, the ratio of the film thickness (e.g., the thickness of the second dielectric layer) on the target surface (e.g., the first dielectric layer) to the film thickness on the non-target surface (e.g., the conductive material). Other definitions of selectivity can be used.

Some selective deposition processes can employ atomic layer deposition (ALD) processes. Some ALD processes can employ water ($H_2O$) as an oxidant. However, ALD processes that employ water as an oxidant may not enable compatibility with respect to implementations in which the first dielectric layer includes a porous hydrophobic dielectric material (e.g., SiCOH). Moreover, some ALD processes employ plasma during film deposition (i.e., plasma-enhanced ALD processes). However, similar to water, ALD processes that employ plasma may not enable compatibility with respect to implementations in which the first dielectric layer includes a porous hydrophobic dielectric material (e.g., SiCOH).

To address these and other drawbacks, embodiments described herein can enable dielectric-on-dielectric (DoD) selective deposition using aniline passivation. More specifically, embodiments described herein can achieve selective deposition of a dielectric layer on another dielectric layer, in preference to a conductive material. For example, the conductive material can form a plurality of conductive lines within a first dielectric layer (e.g., a metallization level). The first dielectric layer can include any suitable dielectric material. In some implementations, the first dielectric layer can include an oxide. In some implementations, the first dielectric layer can include a nitride. Examples of suitable dielectric materials that can be used to form the first dielectric layer include $SiO_2$, carbon-doped silicon oxides, such as SiOC, SiCOH, $Si_3N_4$, etc. The conductive material can include any suitable material. In some embodiments, the conductive material includes a transition metal. Examples of suitable conductive materials include Cu, W, Co, Mo, Ru, etc.

More specifically, performing the DoD selective deposition can include passivating the conductive material (e.g., conductive lines) by exposing the first dielectric layer and the conductive material to aniline (e.g., vapor phase aniline).

Aniline is an aromatic molecule that can include an amine functional group attached to a phenyl group (e.g., $C_6H_5NH_2$). During the aniline exposure, the aniline can exhibit weak or no adsorption with respect to the first dielectric layer, while exhibiting strong adsorption to the surface of the conductive material (e.g., transition metal). The passivation layer can prevent (e.g., block) the adsorption of deposition precursors of a later dielectric (e.g., an oxide) onto the conductive layer during a subsequent deposition process to form the second dielectric layer (i.e., prevent nucleation of the deposition precursors). Accordingly, aniline passivation can enable the selective deposition of the second dielectric layer on the first dielectric layer during the subsequent deposition process, in preference to the conductive material (e.g., without deposition of the second dielectric layer on the passivated metal layer).

For example, for some conductive materials, aniline can undergo a reaction with the conductive material that causes dissociation. More specifically, the reaction can cause deprotonation (i.e., the loss of an H atom from the aniline compound), which can form a bond on the surface of the conductive material (e.g., phenyl-N-metal bond).

As another example, for some conductive materials (e.g., Ru), aniline can exhibit two favorable adsorption modes in which no bonds within the aniline compound are broken. One adsorption mode is a π-bonding configuration in which the entire aniline compound bonds via delocalized π electrons. Another adsorption mode is a donative bonding configuration in which the aniline forms a bond with the conductive layer (e.g., N-metal bond) by donating a pair of electrons from N to the surface of the conductive material.

The passivation can be performed using any suitable process parameters. Examples of process parameters for performing the passivation include temperature, exposure time, pressure, etc. In some embodiments, the aniline exposure is performed at a temperature ranging from about 100° C. to about 350° C. In some embodiments, the aniline exposure is performed at a temperature ranging from about 250° C. to about 350° C. At sufficiently high temperatures, aniline passivation degradation can occur (e.g., temperatures exceeding 350° C.). Thus, the passivation process can be performed below a threshold temperature to maintain aniline passivation quality (e.g., less than or equal to about 350° C.). In some embodiments, the pressure ranges from about 500 millitorr (mTorr) to about 10 torr. In some embodiments, the pressure ranges from about 750 mTorr to about 780 mTorr.

In some embodiments, the conductive material is exposed to aniline for less than or equal to about 60 minutes. In some embodiments, the conductive material is exposed to aniline for less than or equal to about 50 minutes. In some embodiments, the conductive material is exposed to aniline for less than or equal to about 40 minutes. In some embodiments, the conductive material is exposed to aniline for less than or equal to about 30 minutes. In some embodiments, the conductive material is exposed to aniline for less than or equal to about 20 minutes. In some embodiments, the conductive material is exposed to aniline for less than or equal to about 10 minutes. In some embodiments, the conductive material is exposed to aniline for less than or equal to about 5 minutes. In some embodiments, the conductive material is exposed to aniline for less than or equal to about 1 minute.

In some embodiments, a cleaning process can be performed prior to passivating the conductive material (i.e., precleaning). The precleaning process can be optionally performed to improve the selectivity of the second dielectric layer on the first dielectric layer and/or decrease the selectivity of the second dielectric layer on the conductive material. The precleaning process can include a surface clean to remove a native oxide on a surface of the conductive material. The precleaning process can further remove contaminants from the surface of the conductive material. The precleaning process can further reduce defect growth on the conductive material. For example, the precleaning process can include a thermal ethanol (EtOH) treatment, a hydrogen radical treatment, etc.

The precleaning process can be performed using any suitable process parameters. Examples of process parameters for performing the precleaning include amount of time, temperature, pressure, etc. For example, the thermal EtOH treatment can be performed for a time ranging from about 1 minute to about 30 minutes (e.g., about 5 minutes) and at a temperature ranging from about 200° C. to about 300° C. (e.g., about 250° C.). In some embodiments, the pressure ranges from about 100 mTorr to about 10 torr. In some embodiments, the pressure ranges from about 500 mTorr to about 10 torr. In some embodiments, the pressure ranges from about 1 torr to about 10 torr.

After the passivation (and optional precleaning before the passivation), the second dielectric layer can be selectively formed on the exposed surfaces of the first dielectric layer using a deposition process. The second dielectric layer can include any suitable dielectric material. In some embodiments, the second dielectric layer can include an oxide. For example, the second dielectric layer can include a metal oxide. Examples of suitable dielectric materials that can be used to form the second dielectric layer include hafnium dioxide ($HfO_2$), titanium dioxide ($TiO_2$), aluminum oxide ($Al_2O_3$), $SiO_2$, etc. In some embodiments, the second dielectric layer includes a nanolaminate to ensure an amorphous structure. The second dielectric layer can be deposited on the first dielectric layer to a target thickness (e.g., by performing a suitable number of deposition cycles). As mentioned above, the passivation layer formed during the aniline passivation can prevent (e.g., block) adsorption of the deposition precursors on the conductive material. Thus, the aniline passivation can prevent (e.g., inhibit) the formation of the second dielectric layer on the conductive material. Accordingly, due to the aniline passivation, a dielectric layer of negligible thickness can be deposited on the conductive material during the deposition process (e.g., a thickness of less than about 1 nm).

The deposition process can be a water-free and plasma-free deposition process. For example, water and/or plasma can cause desorption of the adsorbed passivation layer. Thus, the aniline can be exposed to the conductive material for a single time prior to the deposition process (i.e., there may be no need to expose the conductive material to aniline multiple times). Moreover, since the deposition process is water-free, the first dielectric layer can be formed with a porous hydrophobic dielectric (e.g., SiCOH).

In some embodiments, the deposition process is a chemical vapor deposition (CVD) process. For example, the CVD process can be a pulsed CVD process. During a pulsed CVD process, a material can be formed by performing alternating deposition precursor pulses and purge gas pulses. A purge gas can be any suitable inert gas. For example, the purge gas can be argon gas (Ar), nitrogen gas ($N_2$), etc.

The deposition process can utilize any suitable deposition precursors and any suitable process parameters. In some embodiments, the deposition process utilizes a deposition precursor to form a metal oxide (e.g., metal alkoxide precursor). Examples of deposition precursors include hafnium tert-butoxide ($Hf(OtBu)_4$) to form $HfO_2$, titanium isopropoxide (Ti(OiPr)$_4$) to form TiO$_2$, aluminum isopropoxide (Al(OiPr)$_3$) to form Al$_2$O$_3$, aluminum-tri-sec-butoxide (Al[OCH(CH$_3$)C$_2$H$_5$]$_3$) to form Al$_2$O$_3$, tetraethoxysilane or tetraethyl orthosilicate (TEOS) (Si(OC$_2$H$_5$)$_4$) to form SiO$_2$, tetrabutoxysilane or tetrabutyl orthosilicate (TBOS) (Si (OC$_4$H$_9$)$_4$) to form SiO$_2$, tetramethoxysilane or tetramethyl orthosilicate (TMOS) (Si(OCH$_3$)$_4$) to form SiO$_2$, etc. The process parameters of the deposition process (e.g., CVD process) can depend on the deposition precursor(s) used to form the second dielectric layer, and the target thickness of the resulting second dielectric layer.

Examples of process parameters for performing a pulsed CVD process include temperature, number of deposition precursor pulses, pulse length (i.e., the length of time of a deposition precursor pulse), purge length (i.e., a length of time of a purge pulse between deposition precursor pulses), pressure deposition precursor vapor pressure, purge gas pressure, etc. In some embodiments, the pulsed CVD process can be performed at a temperature ranging from about 100° C. to about 400° C. In some embodiments, the pulsed CVD process can be performed at a temperature ranging from about 300° C. to about 350° C. In some embodiments, the number of deposition precursor pulses ranges from about 1 pulse to about 1000 pulses. In some embodiments, the number of deposition precursor pulses ranges from about 4 pulses to about 500 pulses. In some embodiments, the number of deposition precursor pulses ranges from about 50 pulses to about 250 pulses. In some embodiments, the pulse length ranges from about 0.1 second (s) to about 4 s. In some embodiments, the purge length ranges from about 0.1 s to about 10 s.

Further details regarding forming a device implementing DoD selective deposition using aniline passivation will now be described below with reference to FIGS. 1A-1D.

FIGS. 1A-1D are cross-sectional views illustrating an example method of forming a device 100 implementing dielectric-on-dielectric selective deposition using aniline passivation, in accordance with some embodiments. As shown in FIG. 1A, a dielectric layer 110-1 can be provided, and a plurality of conductive lines including conductive lines 120-1 and 120-2 can be formed within the dielectric layer 110-1. More specifically, the dielectric layer 110-1 can be an interlevel dielectric (ILD) layer and the conductive lines 120-1 and 120-2 can correspond to a first metallization level within the device 100. Forming the plurality of conductive lines can include forming a plurality of trenches within the dielectric layer 110-1 using an etch process, and forming conductive material within the plurality of trenches to form the plurality of conductive lines. More specifically, each trench corresponds to a respective conductive line. The dielectric layer 110-1 and the conductive lines 120-1 and 120-2 can be included within a base structure on a substrate, such as a semiconductor wafer, in embodiments.

Although not shown, the base structure can include one or more additional layers, such that the dielectric layer 110-1 and the plurality of conductive lines are disposed on the one or more additional layers. For example, the device 100 can further include at least a substrate layer (e.g., silicon (Si)) substrate) (not shown) as an initial layer of the device.

The dielectric layer 110-1 can include any suitable dielectric material. In some implementations, the dielectric layer 110-1 can include an oxide (e.g., a metal oxide). In some implementations, the dielectric layer 110-1 can include a nitride (e.g., a metal nitride). Examples of suitable dielectric materials include SiO$_2$, carbon-doped silicon oxides (e.g., SiOC, SiCOH), Si$_3$N$_4$, etc. The conductive lines 120-1 and 120-2 can be formed from any suitable conductive material (e.g., metal). In some embodiments, the conductive lines 120-1 and 120-2 are formed from a conductive material including a transition metal. Examples of suitable conductive materials that can be used to form the conductive lines 120-1 and 120-2 include Cu, W, Co, Mo, Ru, etc.

As shown in FIG. 1B, a dielectric layer 130 is selectively deposited on the dielectric layer 110-1. The deposition may be performed, for example, using a CVD process. Other deposition processes may also be performed to produce the dielectric layer 130. The dielectric layer 130 can include any suitable dielectric material. In some implementations, the dielectric layer 130 can include an oxide. For example, the dielectric layer 130 can include a metal oxide. Examples of suitable dielectric materials that can be used to form the second dielectric layer include HfO$_2$, TiO$_2$, Al$_2$O$_3$, SiO$_2$, etc.

More specifically, selectively depositing the dielectric layer 130 includes performing a passivation process by exposing the dielectric layer 110-1 and the conductive lines 120-1 and 120-2 to aniline (e.g., vapor phase aniline). The exposure of the conductive line 120-1 and 120-2 to aniline can produce a passivated surface on the surfaces of the conductive lines 120-1 and 120-2.

More specifically, the aniline reacts with the conductive lines 120-1 and 120-2 to form a passivation layer the adsorbs to the surfaces of the conductive lines 120-1 and 120-2. The passivation layer can include byproducts of the aniline reaction that have adsorbed to the surface of the conductive lines 120-1 and 120-2. The passivation layer can prevent (e.g., inhibit) the growth of the dielectric layer 130 on the conductive lines 120-1 and 120-2 by preventing (e.g., blocking) the adsorption of deposition precursors during the deposition of the dielectric layer 130. In some embodiments, the passivation layer has monolayer thickness.

The passivation process can be performed using any suitable process parameters. For example, the passivation process can be a thermal aniline exposure. In some embodiments, the passivation process is performed a single time to form a single passivation layer. Examples of process parameters for performing the passivation process include temperature, exposure time, pressure, etc. In some embodiments, the aniline exposure is performed at a temperature ranging from about 100° C. to about 400° C. In some embodiments, the aniline exposure is performed at a temperature ranging from about 250° C. to about 350° C. In some embodiments, the pressure ranges from about 500 mTorr to about 10 torr. In some embodiments, the pressure ranges from about 750 mTorr to about 780 mTorr.

In some embodiments, the conductive lines 120-1 and 120-2 are exposed to aniline for an amount of time less than or equal to about 60 minutes. In some embodiments, the conductive lines 120-1 and 120-2 are exposed to aniline for an amount of time less than or equal to about 50 minutes. In some embodiments, the conductive lines 120-1 and 120-2 are exposed to aniline for an amount of time less than or equal to about 40 minutes. In some embodiments, the conductive lines 120-1 and 120-2 are exposed to aniline for an amount of time less than or equal to about 30 minutes. In some embodiments, the conductive lines 120-1 and 120-2 are exposed to aniline for an amount of time less than or equal to about 20 minutes. In some embodiments, the conductive lines 120-1 and 120-2 are exposed to aniline for an amount of time less than or equal to about 10 minutes. In some embodiments, the conductive lines 120-1 and 120-2 are exposed to aniline for an amount of time less than or equal to about 5 minutes. In some embodiments, the conductive lines 120-1 and 120-2 are exposed to aniline for an amount of time less than or equal to about 1 minute.

In some embodiments, a precleaning process can be performed prior to passivating the conductive lines 120-1 and 120-2. The precleaning process can improve the selectivity of the dielectric layer 130 on the dielectric layer 110-1 and/or decrease the selectivity of the dielectric layer 130 on the conductive lines 120-1 and 120-2. The precleaning process can include a surface clean to remove a native oxide on a surface of the conductive line 120-1 and 120-2. The precleaning process can further remove contaminants from the surface of the conductive lines 120-1 and 120-2. The precleaning process can further reduce defect growth on the conductive lines 120-1 and 120-2. For example, the precleaning process can include a thermal EtOH treatment, a hydrogen radical treatment, etc. Illustratively, the precleaning process can include a continuous EtOH dosing for a time ranging from about 4 minutes to about 6 minutes (e.g., about 5 minutes) at a temperature ranging from about 200° C. to about 300° C. (e.g., about 250° C.) prior to the passivation. In some embodiments, the pressure ranges from about 100 mTorr to about 10 torr. In some embodiments, the pressure ranges from about 500 mTorr to about 10 torr. In some embodiments, the pressure ranges from about 1 torr to about 10 torr.

After the passivation (and optional precleaning before the passivation), the dielectric layer 130 can be formed using a deposition process. More specifically, the dielectric layer 130 can be selectively deposited on the exposed surfaces of the dielectric layer 110. The deposition process can be a water-free deposition process and a plasma-free deposition process. In some embodiments, the deposition process is a CVD process. For example, the CVD process can be a pulsed CVD process. Other deposition processes may also be used. A dielectric layer of negligible thickness can be deposited on the conductive material during the deposition process due to the aniline passivation (e.g., a thickness of less than about 1 nm). This thin dielectric layer may be removed during further processing (e.g., during a subsequent metal deposition process and/or cleaning process).

The deposition process can utilize any suitable deposition precursors and any suitable process parameters. In some embodiments, the deposition process utilizes a deposition precursor to form a metal oxide (e.g., a metal alkoxide precursor). Examples of deposition precursors include hafnium tert-butoxide to form $HfO_2$, titanium isopropoxide to form $TiO_2$, aluminum isopropoxide to form $Al_2O_3$, aluminum-tri-sec-butoxide to form $Al_2O_3$, TEOS to form $SiO_2$, TBOS to form $SiO_2$, TMOS to form $SiO_2$, etc. The process parameters of the deposition process (e.g., CVD process) can depend on the deposition precursor(s) used to form the second dielectric layer, and the target thickness of the resulting second dielectric layer.

Examples of process parameters for performing a pulsed CVD process include temperature, number of pulses, pulse length (i.e., the length of time during which a deposition precursor is pulsed), purge length (i.e., a length of time during which a purging gas (e.g., Ar or $N_2$) is introduced between pulses), deposition precursor vapor pressure, purge gas pressure, etc. For example, the pulsed CVD process can be performed at a temperature ranging from about 100° C. to about 400° C. As another example, the pulse length can range from about 0.1 second (s) to about 4 s. As yet another example, the purge length can range from about 0.1 s to about 10 s. Further details regarding the deposition process will be described below with reference to FIGS. 2A-2B.

After forming the dielectric layer 130, an optional post-cleaning process can be performed. Performing the post-cleaning process can include removing the passivation layer and/or a thin dielectric layer from surfaces of the conductive material. For example, performing the post-cleaning process can include heating the device to a temperature greater than or equal to 350° C. heating the device to a temperature greater than or equal to 350° C. can cause desorption of the passivation layer. As another example, performing the post-cleaning process can further include removing defects (e.g., portions of dielectric material that may have formed on the conductive material during the deposition process). As another example, the post-cleaning process can be a plasma cleaning process. As yet another example, the post-cleaning process can be a remote plasma cleaning process.

As shown in FIG. 1C, after selectively depositing the dielectric layer 130 on the dielectric layer 110-1, a dielectric layer 110-2 can be formed on the plurality of conductive lines and the dielectric layer 130. More specifically, the dielectric layer 110-2 can be a second ILD layer. The dielectric layer 110-2 can include any suitable dielectric material. In some embodiments, the dielectric layer 110-2 can include an oxide. In some embodiments, the dielectric layer 110-2 can include a nitride. Examples of suitable dielectric materials include $SiO_2$, carbon-doped silicon oxides (e.g., SiOC, SiCOH), $Si_3N_4$, etc. In some embodiments, the dielectric layer 110-2 includes the same dielectric material as the dielectric layer 110-1. In some embodiments, the dielectric layer 110-2 includes a different dielectric material from the dielectric layer 110-1.

As shown in FIG. 1D, at least one via 140 is formed. More specifically, the via 140 can be formed in contact with at least the conductive line 120-2. As further shown in this illustrative example, at least one conductive line 150 is formed. More specifically, the conductive line 150 can correspond to a second metallization level different from the first metallization level (i.e., at least one metallization level higher than the first metallization level).

Forming the via 140 and the conductive line 150 can include forming a trench within the dielectric layer 110-2, forming a via hole within the dielectric layer 110-2, and forming conductive material within the trench and the via hole. In some embodiments, the via 140 and the conductive line 150 are formed simultaneously (e.g., using a dual damascene process). In some embodiments, the via 140 and the conductive line 150 are formed sequentially (e.g., using a single damascene process).

The via 140 and the conductive line 150 can include any suitable conductive material (e.g., metal). In some embodiments, the via 140 and the conductive line 150 are formed from a conductive material including a transition metal. Examples of suitable conductive materials that can be used to form the via 140 and the conductive line 150 include Cu, W, Co, Mo, Ru, etc. In some embodiments, the via 140 and the conductive line 150 can include the same material as the conductive lines 120-1 and 120-2. In some embodiments, the via 140 and the conductive line 150 can include a different material from the conductive lines 120-1 and 120-2.

As shown in FIG. 1D, the via 140 in this example is a misaligned via having an edge that is disposed on the dielectric layer 130 between the conductive lines 120-1 and 120-2. The distance between the via 140 and the conductive line 120-1 is denoted by the diagonal line "D" in FIG. 1D. The diagonal line D has a greater length than a horizontal line that would have denoted the separation between the via 140 and the conductive line 120-1 in the absence of the dielectric layer 130. Therefore, the formation of the dielectric layer 130 can improve by the performance of the device 100 by reducing shorting or capacitive coupling between the via 140 and the conductive line 120-1. Further details regarding forming the device 100 will now be described below with reference to FIGS. 2A-2B.

FIG. 2A depicts an example method 200 of implementing DoD selective deposition using aniline passivation, in accordance with some embodiments. The method 200 can be performed within an electronic device processing system. More specifically, the method 200 can be performed within one or more process chambers of the electronic device processing system. Further details regarding the electronic device processing system will be described below with reference to FIG. 3.

At step 210, a first conductive material is formed on a first dielectric layer. For example, the first dielectric layer can be provided, and the first conductive material can be formed on the first dielectric layer. In some embodiments, forming the first conductive material includes forming a plurality of conductive lines within the first dielectric layer. More specifically, the first dielectric layer can be an ILD layer and the plurality of conductive lines can correspond to a first metallization level within the device. Forming the plurality of conductive lines can include forming a plurality of trenches within the first dielectric layer using an etch process, and forming the conductive material within the plurality of trenches to form the plurality of conductive lines. More specifically, each trench corresponds to a respective conductive line.

The first dielectric layer and the conductive material (e.g., plurality of conductive lines) can be included within a base structure. The base structure can include one or more additional layers, such that the first dielectric layer and the conductive material are disposed on the one or more additional layers. For example, the device can further include at least a substrate layer (e.g., silicon (Si)) substrate) as an initial layer of the device.

The first dielectric layer can include any suitable dielectric material. In some implementations, the first dielectric layer can include an oxide. In some implementations, the first dielectric layer can include a nitride. Examples of suitable dielectric materials that can be used to form the first dielectric layer include SiO$_2$, carbon-doped silicon oxides (e.g., SiOC, SiCOH), Si$_3$N$_4$, etc. The conductive material can include any suitable conductive material (e.g., metal). In some embodiments, the conductive material includes a transition metal. Examples of suitable conductive materials include Cu, W, Co, Mo, Ru, etc.

At step 220, a second dielectric layer is selectively deposited on the first dielectric layer using a deposition process. The second dielectric layer can include any suitable dielectric material. In some implementations, the second dielectric layer can include an oxide. For example, the second dielectric layer can include a metal oxide. Examples of suitable dielectric materials that can be used to form the second dielectric layer include HfO$_2$, TiO$_2$, Al$_2$O$_3$, SiO$_2$, etc. More specifically, selectively depositing the second dielectric layer can include passivating the conductive material (e.g., the plurality of conductive lines) with aniline. Further details regarding selectively depositing the second dielectric layer will now be described below with reference to FIG. 2B.

Figure 2B:
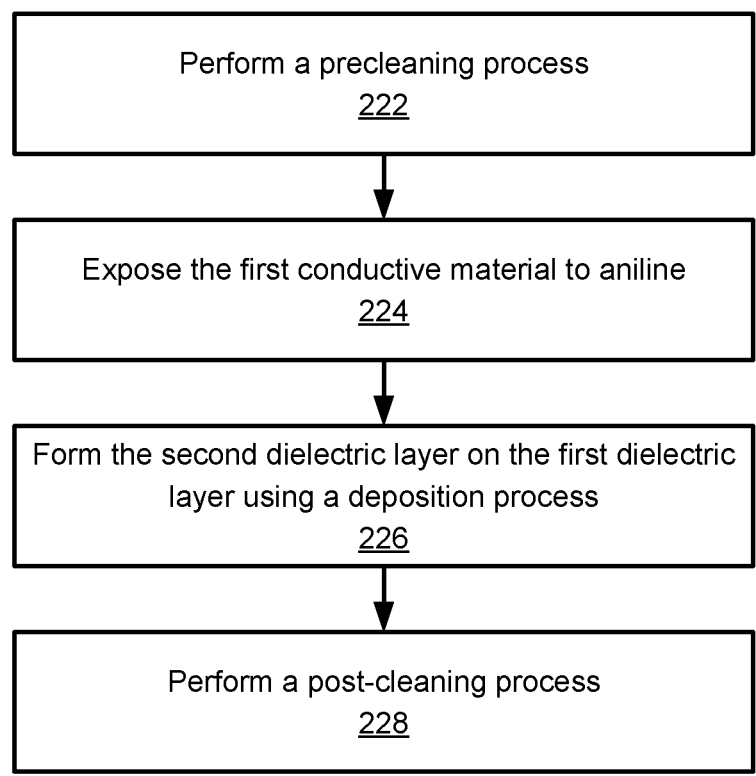

FIG. 2B depicts an example method 220 of selectively depositing a second dielectric layer on a first dielectric layer using aniline passivation, in accordance with some embodiments. The method 220 can be performed within an electronic device processing system. More specifically, the method 220 can be performed within one or more process chambers of the electronic device processing system.

At step 222, a precleaning process is optionally performed. More specifically, the base structure including the conductive material formed on the first dielectric layer (e.g., the plurality of conductive lines disposed within the first dielectric layer) can be cleaned. The precleaning process can improve the selectivity of a second dielectric layer to be formed on the first dielectric layer and/or decrease the selectivity of the second dielectric layer to be formed on the conductive material. The precleaning process can include a surface clean to remove a native oxide on a surface of the conductive material. The precleaning process can further remove contaminants from the surface of the conductive material. The precleaning process can further reduce defect growth on the conductive material. For example, the precleaning can include a thermal EtOH treatment, a hydrogen radical treatment, etc. Illustratively, the precleaning process can include a continuous EtOH dosing for a time ranging from about 4 minutes to about 6 minutes (e.g., about 5 minutes) at a temperature ranging from about 200° C. to about 300° C. (e.g., about 250° C.) prior to the passivation. In some embodiments, the pressure ranges from about 100 mTorr to about 10 torr. In some embodiments, the pressure ranges from about 500 mTorr to about 10 torr. In some embodiments, the pressure ranges from about 1 torr to about 10 torr.

At step 224, the first conductive material is exposed to aniline. In some embodiments, the aniline includes vapor phase aniline. More specifically, the first conductive material (and the first dielectric layer) can be exposed to aniline to produce a passivated surface of the conductive material. The aniline can react strongly to the first conductive material to form a passivation layer that adsorbs to the surface of the conductive material and prevents (e.g., inhibits) the growth of the second dielectric layer on the conductive material. More specifically, the passivation layer can prevent (e.g., block) the adsorption of the deposition precursors on the surface of the first conductive material used during a subsequent deposition process to form the second dielectric layer. In some embodiments, the first conductive material is exposed to aniline during a single passivation process to form a single passivation layer. In some embodiments, the passivation layer has a monolayer thickness. However, the passivation layer can have any suitable thickness in accordance with embodiments described herein.

The aniline exposure can be performed at a suitable temperature. For example, the aniline exposure can be performed at a temperature ranging from about 100° C. to about 400° C. The aniline exposure can be performed for any suitable amount of time. In some embodiments, the conductive material is exposed to aniline for an amount of time ranging from about 30 minutes to about 60 minutes. For example, the conductive material can be exposed to aniline for about 40 minutes.

At step 226, the second dielectric layer is formed using a deposition process. More specifically, the second dielectric layer can be selectively deposited on exposed surfaces of the first dielectric layer. As mentioned above, the passivation layer formed on the conductive material prevents (e.g., blocks) the adsorption of deposition precursors used during the deposition process to form the second dielectric layer. The deposition process can be a water-free deposition process and a plasma-free deposition process. In some embodiments, the deposition process is a CVD process. For example, the CVD process can be a pulsed CVD processA dielectric layer of negligible thickness can be deposited on the conductive material during the deposition process due to the aniline passivation (e.g., a thickness of less than about 1 nm).

The deposition process can utilize any suitable deposition precursors and any suitable process parameters. In some embodiments, the deposition process utilizes a deposition precursor to form a metal oxide (e.g., metal alkoxide precursor). Examples of deposition precursors include hafnium tert-butoxide to form $HfO_2$, titanium isopropoxide to form $TiO_2$, aluminum isopropoxide to form $Al_2O_3$, aluminum-tri-sec-butoxide to form $Al_2O_3$, TEOS to form $SiO_2$, TBOS to form $SiO_2$, TMOS to form $SiO_2$, etc. The process parameters of the deposition process (e.g., CVD process) can depend on the deposition precursor(s) used to form the second dielectric layer, and the target thickness of the resulting second dielectric layer.

Examples of process parameters for performing a pulsed CVD process include temperature, number of deposition precursor pulses, pulse length (i.e., the length of time of a deposition precursor pulse), purge length (i.e., a length of time of a purge pulse between deposition precursor pulses), pressure deposition precursor vapor pressure, purge gas pressure, etc. In some embodiments, the pulsed CVD process can be performed at a temperature ranging from about 100° C. to about 400° C. In some embodiments, the pulsed CVD process can be performed at a temperature ranging from about 300° C. to about 350° C. In some embodiments, the number of deposition precursor pulses ranges from about 1 pulse to about 1000 pulses. In some embodiments, the number of deposition precursor pulses ranges from about 4 pulses to about 500 pulses. In some embodiments, the number of deposition precursor pulses ranges from about 50 pulses to about 250 pulses. In some embodiments, the pulse length ranges from about 0.1 second (s) to about 4 s. In some embodiments, the purge length ranges from about 0.1 s to about 10 s.

As an illustrative example, assume that the first dielectric layer includes $SiO_2$ and the conductive material has been passivated via aniline exposure as described above. Further assume that the second dielectric layer includes $HfO_2$. $HfO_2$ can be deposited on $SiO_2$ using a pulsed CVD process with a hafnium tert-butoxide precursor at a temperature ranging between about 250° C. to about 350° C. (e.g., about 300° C.). The vapor pressure of the hafnium tert-butoxide precursor can be between about 0.1 mTorr and about 0.5 mTorr (e.g., about 0.3 mTorr). A time interval of about 60 s can exist between each pulse of the hafnium tert-butoxide precursor. A purge gas having a pressure of about 120 mTorr (e.g., Ar or $N_2$) can be used during each purge pulse between hafnium tert-butoxide precursor pulses. After about 60 pulses of the hafnium tert-butoxide precursor, about 5 nm of $HfO_2$ can be deposited on the $SiO_2$.

As another illustrative example, assume that the first dielectric layer includes $SiO_2$ and the conductive material has been passivated via aniline exposure as described above. Further assume that the second dielectric layer includes $Al_2O_3$. $Al_2O_3$ can be deposited on $SiO_2$ using a pulsed CVD process with an aluminum tri-sec-butoxide precursor at a temperature ranging between about 300° C. to about 375° C. (e.g., about 330° C.). The vapor pressure of the aluminum tri-sec-butoxide precursor can be between about 0.1 mTorr and about 0.5 mTorr (e.g., about 0.3 mTorr). A time interval of about 60 s can exist between each pulse of the aluminum tri-sec-butoxide precursor. A purge gas having a pressure of about 120 mTorr (e.g., Ar or $N_2$) can be used during each purge pulse between aluminum tri-sec-butoxide precursor pulses. After about 200 pulses of the aluminum tri-sec-butoxide precursor, about 5 nm of $Al_2O_3$ can be deposited on the $SiO_2$.

At step 228, an optional post-cleaning process can be performed. More specifically, the post-cleaning process can be performed after forming the second dielectric layer. Performing the post-cleaning process can include removing the passivation layer from surfaces of the conductive material. For example, performing the post-cleaning process can include heating the device to a temperature greater than or equal to 350° C. As another example, performing the post-cleaning process can further include removing defects (e.g., portions of dielectric material that may have formed on the conductive material during the deposition process). As another example, the post-cleaning process can be a plasma cleaning process. As yet another example, the post-cleaning process can be a remote plasma cleaning process.

Referring back to FIG. 2A, at step 230, a third dielectric layer is formed over the second dielectric layer and the conductive material. For example, the third dielectric layer can be a second ILD layer. The third dielectric layer can include any suitable dielectric material. In some embodiments, the third dielectric layer can include an oxide. In some embodiments, the third dielectric layer can include a nitride. Examples of suitable dielectric materials that can be used to form the third dielectric layer include $SiO_2$, carbon-doped silicon oxides (e.g., SiOC, SiCOH), $Si_3N_4$, etc. In some embodiments, the third dielectric layer includes the same dielectric material as the first dielectric layer (i.e., the first ILD layer). In some embodiments, the third dielectric layer includes a different dielectric material from the first dielectric layer.

At step 240, a second conductive material is formed on the third dielectric layer. In some embodiments, forming the second conductive material includes forming a via within the third dielectric layer. For example, a first end of the via can be in contact with at least a portion of a first conductive line of the plurality of conductive lines. In some embodiments, forming the second conductive material further includes forming a second conductive line. More specifically, the second conductive line can be disposed at a second end of the via. The second conductive line can correspond to a second metallization level different from the first metallization level (i.e., at least one metallization level higher than the first metallization level).

Forming the via and the second conductive line can include forming a trench within the third dielectric layer, forming a via hole within the third dielectric layer, and forming a conductive material within the trench and the via hole. In some embodiments, the via and the second conductive line can be formed simultaneously (e.g., using a dual damascene process). In some embodiments, the via and the second conductive line can be formed sequentially (e.g., using a single damascene process).

The second conductive material can include any suitable conductive material (e.g., metal). Examples of suitable conductive materials for the second conductive material include Cu, W, Co, Mo, Ru, etc. In some embodiments, the first conductive material includes the same material as the second conductive material. In some embodiments, the first conductive material includes a different material from the second conductive material. Further details regarding steps 210-240 are described above with reference to FIGS. 1A-1D.

Figure 3:
FIG. 3 is a block diagram of an example electronic device processing system that can be used to implement dielectric-on-dielectric (DoD) selective deposition using aniline passivation, in accordance with some embodiments.

FIG. 3 is a block diagram of an example electronic device processing system ("system") 300 that can be used to form a device implementing DoD selective deposition using CVD, in accordance with some embodiments. For example, the system 300 can be used to form the device 100 described above with reference to FIGS. 1A-1D, and can implement the method 200 described above with reference to FIGS. 2A-2B.

As shown, the system 300 includes a passivation chamber 310, a transfer chamber 320, and a deposition chamber 330. An interface 340-1 can be disposed between the passivation chamber 310 and the transfer chamber 320, and an interface 340-2 can be disposed between the transfer chamber and the deposition chamber 330. In some embodiments, the interfaces 340-1 and 340-2 are respective gate valves. The transfer chamber 320 can include a transfer robot (not shown). The transfer chamber 320, passivation chamber 310, and deposition chamber 330 may each be maintained under vacuum in controlled conditions (e.g., with little or no humidity). Although not shown, the system 300 can further include at least one load lock chamber and at least one factory interface to enable the movement of substrates from atmosphere to the transfer chamber 320. Accordingly, substrates may be transferred between chambers without breaking vacuum, and thus without exposing a substrate to air and/or humidity.

The passivation chamber 310 can receive a substrate including a first dielectric layer and conductive material, and passivate the conductive material by exposing the conductive material to aniline. For example, the aniline can include vapor phase aniline. The passivation chamber 310 can be operatively coupled to at least one passivation gas store 312. For example, the at least one passivation gas store 312 can include an aniline store. The at least one passivation gas store 312 can further include a purge gas store. The purge gas store can include any suitable inert gas for purging the passivation chamber 312 during the passivation process (e.g., Ar or $N_2$). The passivation process can be performed using any suitable passivation process parameters. Further details regarding passivating the conductive material with aniline are described above with reference to FIGS. 1A-2B.

After passivating the conductive material, the transfer robot can transfer the substrate to the deposition chamber 330. After receiving the substrate, the deposition chamber 330 can perform a deposition process to form a second dielectric layer selectively on the first dielectric layer. More specifically, the deposition process can be a water-free and plasma free deposition process. In some embodiments, the deposition process is a CVD process. For example, the deposition process can be a pulsed CVD process.

The deposition chamber 330 can be operatively coupled to a deposition precursor store 332 and a purge gas store 334. The deposition precursor store 332 can include any suitable deposition precursor(s) for forming the second dielectric layer. The purge gas store 334 can include any suitable inert gas for purging the deposition chamber 330 during the deposition process (e.g., Ar or $N_2$). The deposition process can be performed using any suitable deposition process parameters. Further details regarding performing the deposition process are described above with reference to FIGS. 1A-2B.

In some embodiments, the deposition process is performed in the passivation chamber 310 (i.e., the passivation chamber 310 is a process chamber configured to perform the passivation process and the deposition process). In these embodiments, the deposition precursor store 332 and the purge gas store 334 can be operatively coupled to the passivation chamber 310. In some embodiments, the passivation process is performed in the deposition chamber 330 (i.e., the deposition chamber 330 is a process chamber configured to perform the passivation process and the deposition process). In these embodiments, the at least one passivation gas store 312 can be operatively coupled to the deposition chamber 330.

In some embodiments, the system 300 can optionally include a cleaning chamber 350 to perform an optional cleaning process before passivation (i.e., precleaning process) and/or an optional cleaning process after the formation of the second dielectric layer (i.e., post-cleaning process). An interface 340-3 can be disposed between the cleaning chamber 350 and the transfer chamber 320. In some embodiments, the cleaning chamber 350 is an in-situ cleaning chamber, and the interface 340-3 is a gate valve. In some embodiments, the cleaning chamber 350 is an ex-situ cleaning chamber, and the interface 340-3 is a load lock chamber.

For example, the precleaning process can be a thermal EtOH treatment. As another example, the precleaning process can be a hydrogen radical treatment. The precleaning process and/or the post-cleaning process can be performed using any suitable precleaning process parameters.

For example, performing the post-cleaning process can include heating the device to a temperature greater than or equal to 350° C. As another example, performing the post-cleaning process can further include removing defects (e.g., portions of dielectric material that may have formed on the conductive material during the deposition process). As another example, the post-cleaning process can be a plasma cleaning process. As yet another example, the post-cleaning process can be a remote plasma cleaning process. The post-cleaning process can be performed using any suitable post-cleaning process parameters.

The cleaning chamber 350 can be operatively coupled to at least one cleaning gas store 352. The at least one cleaning gas store 352 can include a suitable cleaning chemistry. For example, the at least one cleaning gas store 352 can include an ethanol store for performing a thermal EtOH clean. The at least one passivation gas store 312 can further include a purge gas store. The purge gas store can include any suitable inert gas for purging the cleaning chamber 352 (e.g., Ar or $N_2$).

In some embodiments, the precleaning process can be performed in the same chamber as passivation (e.g., the passivation chamber 310 or the deposition chamber 330). In these embodiments, the at least one cleaning gas store 352 can be operatively coupled to the passivation chamber 310 and/or the deposition chamber 330. In some embodiments, the post-cleaning process can be performed in the passivation chamber 310 and/or the deposition chamber 330. In these embodiments, the at least one cleaning gas store 352 can be operatively coupled to the passivation chamber 310 and/or the deposition chamber 330. Further details regarding performing cleaning processes (e.g., precleaning process and/or post-cleaning process) are described above with reference to FIGS. 1A-2B.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
 forming a conductive material within at least one trench formed in a first dielectric layer;
 exposing, for less than or equal to about 60 minutes at a temperature of less than or equal to about 350° C., the conductive material to aniline to produce a passivated surface of the conductive material; and
 after exposing the conductive material to aniline, forming a second dielectric layer on the first dielectric layer by performing a pulsed chemical vapor deposition (CVD) process using a set of process parameters, wherein the pulsed CVD process is a water-free and plasma-free deposition process, wherein the second dielectric layer does not form on the passivated surface of the conductive material, and wherein the set of process parameters comprises:
  a temperature less than or equal to about 350° C.;
  a number of deposition precursor pulses ranging from about 50 pulses to about 250 pulses; and
  a deposition precursor pulse length ranging from about 0.1 second to about 4 seconds.

2. The method of claim 1, further comprising, prior to exposing the conductive material to aniline, performing a precleaning process to reduce a native oxide on a surface of the conductive material.

3. The method of claim 1, wherein the conductive material comprises a conductive line associated with a metallization level of a device, and wherein the first dielectric layer is an interlevel dielectric (ILD) layer for the device.

4. The method of claim 1, wherein the first dielectric layer comprises at least one of: silicon dioxide, a carbon-doped silicon oxide, or silicon nitride.

5. The method of claim 1, wherein the conductive material comprises a transition metal.

6. The method of claim 1, wherein the second dielectric layer comprises a metal oxide.

7. The method of claim 1, further comprising:
 forming a third dielectric layer over the second dielectric layer and the conductive material; and
 forming a second conductive material on the third dielectric layer.

8. The method of claim 7, wherein the second conductive material comprises a via, and wherein the first dielectric layer is an interlevel dielectric (ILD) layer.

9. A system comprising at least one chamber, the at least one chamber being configured to:
 expose, for less than or equal to about 60 minutes at a temperature of less than or equal to about 350° C., a conductive material to aniline to produce a passivated surface of the conductive material, wherein the conductive material is formed within at least one trench formed in a first dielectric layer; and
 after exposing the conductive material to aniline, form a second dielectric layer on the first dielectric layer by performing a pulsed chemical vapor deposition (CVD) process using a set of process parameters, wherein the pulsed CVD process is a water-free and plasma-free deposition process, wherein the second dielectric layer does not form on the passivated surface of the conductive material, and wherein the set of process parameters comprises:
  a temperature less than or equal to about 350° C.;
  a number of deposition precursor pulses ranging from about 50 pulses to about 250 pulses; and
  a deposition precursor pulse length ranging from about 0.1 second to about 4 seconds.

10. The system of claim 9, wherein the at least one chamber is further configured to, prior to exposing the conductive material to aniline, perform a precleaning process to reduce a native oxide on a surface of the conductive material.

11. The system of claim 9, further comprising a deposition precursor store and a purge gas store each operatively coupled to the at least one chamber.

12. The system of claim 11, wherein the deposition precursor store maintains a deposition precursor selected from the group consisting of: hafnium tert-butoxide, titanium isopropoxide, aluminum isopropoxide, aluminum-tri-sec-butoxide, tetraethyl orthosilicate (TEOS), tetrabutyl orthosilicate (TBOS), or tetramethyl orthosilicate (TMOS).

13. The system of claim 9, wherein the first dielectric layer comprises at least one of: silicon dioxide, a carbon-doped silicon oxide, or silicon nitride.

14. The system of claim 9, wherein the conductive material comprises a transition metal.

15. The system of claim 9, wherein the second dielectric layer comprises a metal oxide.

16. The system of claim 9, wherein the at least one chamber is further configured to:
 form a third dielectric layer over the second dielectric layer and the conductive material; and
 form a second conductive material on the third dielectric layer.

* * * * *